US010269593B2

(12) United States Patent
Griffith Cruz et al.

(10) Patent No.: US 10,269,593 B2
(45) Date of Patent: Apr. 23, 2019

(54) APPARATUS FOR COUPLING A HOT WIRE SOURCE TO A PROCESS CHAMBER

(71) Applicant: APPLIED MATERIALS, INC., Santa Clara, CA (US)

(72) Inventors: Joe Griffith Cruz, San Jose, CA (US); Hanh Nguyen, San Jose, CA (US); Randy Vrana, Austin, TX (US); Karl Armstrong, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 706 days.

(21) Appl. No.: 14/771,494

(22) PCT Filed: Mar. 7, 2014

(86) PCT No.: PCT/US2014/021645
§ 371 (c)(1),
(2) Date: Aug. 30, 2015

(87) PCT Pub. No.: WO2014/149962
PCT Pub. Date: Sep. 25, 2014

(65) Prior Publication Data
US 2016/0005631 A1    Jan. 7, 2016

Related U.S. Application Data

(60) Provisional application No. 61/785,574, filed on Mar. 14, 2013.

(51) Int. Cl.
*H01L 21/67* (2006.01)
*H01L 21/687* (2006.01)
*C23C 16/27* (2006.01)

(52) U.S. Cl.
CPC .. *H01L 21/67109* (2013.01); *H01L 21/67017* (2013.01); *H01L 21/68785* (2013.01); *C23C 16/271* (2013.01)

(58) Field of Classification Search
CPC ......... B23K 35/222; B26F 33/06–3/12; B27M 1/06; C23C 16/24; C23C 16/27;
(Continued)

(56) References Cited

U.S. PATENT DOCUMENTS 4,970,986 A * 11/1990 Anthony ............... C23C 16/271
                                                       118/724
5,146,481 A *  9/1992 Garg ..................... C23C 16/271
                                                       378/35
(Continued)

FOREIGN PATENT DOCUMENTS

KR    10-1998-0065195 A    10/1998
KR    10-2011-0061334 A    6/2011
(Continued)

OTHER PUBLICATIONS

International Search Report and Written Opinion dated May 30, 2014 for PCT Application No. PCT/US2014/021645.
(Continued)

*Primary Examiner* — Parviz Hassanzadeh
*Assistant Examiner* — Stanislav Antolin
(74) *Attorney, Agent, or Firm* — Moser Taboada; Alan Taboada

(57) ABSTRACT

Apparatus for coupling a hot wire source to a process chamber is provided herein. In some embodiments, an apparatus for coupling a hot wire source to a process chamber may include: a housing having an open end and a through hole formed through a top and a bottom of the housing; and a filament assembly configured to be disposed within the housing, the filament assembly having a frame and a plurality of filaments disposed across the frame, wherein the plurality of filaments of the filament assembly are substantially parallel with the top and the bottom of the housing and at least a portion of the plurality of filaments are
(Continued)

disposed within the through hole of the housing when the filament assembly is disposed within the housing.

19 Claims, 4 Drawing Sheets

(58) Field of Classification Search
CPC ..... C23C 16/271; C23C 16/273; C23C 16/44; C23C 16/448; C22C 32/0021; C30B 25/10; C30B 29/04; C30B 29/06; H01L 21/67109; H01L 21/67115; H01L 21/68785; H01L 29/06; H01L 21/67017
See application file for complete search history.

(56) References Cited

U.S. PATENT DOCUMENTS

| | | | |
|---|---|---|---|
| H1249 H * | 11/1993 | Machonkin et al. | 148/DIG. 122 |
| 5,397,737 A * | 3/1995 | Mahan | C23C 16/24 136/258 |
| 5,776,819 A * | 7/1998 | Mahan | C23C 16/24 148/DIG. 1 |
| 5,855,883 A | 1/1999 | Koh et al. | |
| 6,009,831 A * | 1/2000 | Hwang | C23C 16/45565 118/715 |
| 6,124,186 A * | 9/2000 | Molenbroek | C23C 16/24 148/DIG. 1 |
| 6,251,183 B1 * | 6/2001 | Iwancizko | C30B 25/10 117/8 |
| 6,375,756 B1 | 4/2002 | Ishibashi | |
| 6,383,954 B1 * | 5/2002 | Wang | C23C 16/401 257/E21.275 |
| 6,468,885 B1 * | 10/2002 | Mahan | C23C 16/24 257/E21.101 |
| 6,497,734 B1 | 12/2002 | Barber et al. | |
| 7,815,813 B2 * | 10/2010 | Takao | H01J 37/3244 156/345.25 |
| 8,419,856 B2 * | 4/2013 | Gunji | C23C 16/4557 117/90 |
| 9,127,364 B2 * | 9/2015 | Bour | C23C 16/301 |
| 9,589,794 B2 * | 3/2017 | Finger | C23C 16/24 |
| 9,673,042 B2 * | 6/2017 | Visser | H01L 21/02271 |
| 2001/0031541 A1 * | 10/2001 | Madan | C23C 16/4583 438/482 |
| 2004/0219737 A1 * | 11/2004 | Quon | H01J 37/321 438/222 |
| 2005/0109276 A1 * | 5/2005 | Iyer | C23C 16/345 118/715 |
| 2005/0172905 A1 * | 8/2005 | Kaszuba | C23C 16/4401 118/728 |
| 2006/0096540 A1 * | 5/2006 | Choi | C23C 16/45574 118/724 |
| 2006/0185595 A1 * | 8/2006 | Coll | B82Y 30/00 118/724 |
| 2006/0254513 A1 * | 11/2006 | Kang | C23C 16/44 118/715 |
| 2006/0254514 A1 * | 11/2006 | Kang | C23C 16/44 118/715 |
| 2006/0257569 A1 * | 11/2006 | Kim | C23C 16/24 427/248.1 |
| 2007/0128861 A1 * | 6/2007 | Kim | C23C 16/24 438/680 |
| 2008/0078325 A1 * | 4/2008 | Matsuda | C23C 16/0218 118/723 HC |
| 2009/0223452 A1 * | 9/2009 | Nasman | C23C 16/4557 118/724 |
| 2009/0263911 A1 * | 10/2009 | Takao | H01J 37/3244 436/149 |
| 2009/0277386 A1 * | 11/2009 | Takagi | C23C 16/4401 118/724 |
| 2009/0280650 A1 * | 11/2009 | Lubomirsky | B08B 7/00 438/694 |
| 2010/0206229 A1 * | 8/2010 | He | C23C 16/4412 118/719 |
| 2011/0045676 A1 * | 2/2011 | Park | C23C 16/401 438/771 |
| 2011/0061595 A1 * | 3/2011 | Nasman | C23C 16/4557 118/724 |
| 2011/0108195 A1 * | 5/2011 | Nishimoto | H01J 37/32192 156/345.37 |
| 2011/0126762 A1 * | 6/2011 | Faguet | C23C 16/452 118/723 ER |
| 2011/0244128 A1 * | 10/2011 | Brcka | C23C 16/44 427/248.1 |
| 2011/0268880 A1 * | 11/2011 | Bour | C23C 16/301 427/255.28 |
| 2011/0305831 A1 * | 12/2011 | Lee | C23C 16/44 427/248.1 |
| 2012/0213929 A1 | 8/2012 | Lee | |
| 2012/0219921 A1 | 8/2012 | Shibagaki et al. | |
| 2012/0225191 A1 * | 9/2012 | Yudovsky | C23C 16/45527 427/58 |
| 2012/0228129 A1 * | 9/2012 | Ito | C23C 16/24 204/298.02 |
| 2012/0269967 A1 * | 10/2012 | Yudovsky | C23C 16/452 427/255.26 |
| 2012/0279452 A1 * | 11/2012 | Gunji | C23C 16/4557 118/724 |
| 2012/0289078 A1 * | 11/2012 | Narwankar | C23C 16/44 439/485 |
| 2013/0160794 A1 | 6/2013 | Griffith Cruz et al. | |
| 2013/0164445 A1 * | 6/2013 | Kwong | C23C 16/448 427/255.5 |
| 2013/0230651 A1 * | 9/2013 | Kai | C23C 16/44 427/248.1 |
| 2014/0113084 A1 * | 4/2014 | Nguyen | C23C 16/44 427/585 |
| 2014/0235036 A1 * | 8/2014 | Finger | C23C 16/24 438/478 |
| 2017/0062210 A1 * | 3/2017 | Visser | H01L 21/02271 |

FOREIGN PATENT DOCUMENTS

| | | | | |
|---|---|---|---|---|
| WO | WO-2011062286 A1 * | 5/2011 | ............. | C23C 16/24 |
| WO | WO-2011087049 A1 * | 7/2011 | ......... | C23C 16/4557 |
| WO | WO-2011149615 A2 * | 12/2011 | ............. | C23C 16/24 |
| WO | WO-2012057128 A1 * | 5/2012 | ............. | C23C 16/44 |
| WO | WO-2012142992 A1 * | 10/2012 | ............. | C23C 16/24 |
| WO | WO-2014066100 A1 * | 5/2014 | ............. | C23C 16/44 |

OTHER PUBLICATIONS

Search Report for Taiwan Invention Patent Application No. 103108404, dated Jul. 14, 2017.

* cited by examiner

APPARATUS FOR COUPLING A HOT WIRE SOURCE TO A PROCESS CHAMBER

FIELD

Embodiments of the present invention generally relate to semiconductor substrate processing.

BACKGROUND

The inventors have observed that conventional process chambers that utilize hot wire sources typically include a filament (wire) configuration that is not easily changed or replaced without causing unacceptable down time of the process chamber.

Therefore, the inventors have provided an apparatus for coupling a hot wire source to a process chamber in accordance with some embodiments of the present invention.

SUMMARY

An apparatus for coupling a hot wire source to a process chamber is provided herein. In some embodiments, an apparatus for coupling a hot wire source to a process chamber may include: a housing having an open end and a through hole formed through a top and a bottom of the housing; and a filament assembly configured to be disposed within the housing, the filament assembly having a frame and a plurality of filaments disposed across the frame, wherein the plurality of filaments of the filament assembly are substantially parallel with the top and the bottom of the housing and at least a portion of the plurality of filaments are disposed within the through hole of the housing when the filament assembly is disposed within the housing.

In some embodiments, a process chamber may include: a chamber body having a lid, a hot wire source coupled to the chamber body, comprising: a housing having a first open end and a through hole formed through a top and a bottom of the housing, the through hole configured to correspond with a showerhead disposed in the process chamber, wherein the top of the housing is configured to be coupled to the lid of the chamber body, and the bottom of the housing is configured to be coupled to the chamber body; and a filament assembly configured to be disposed within the housing, the filament assembly having a frame and a plurality of filaments disposed across the frame, wherein the plurality of filaments of the filament assembly are substantially parallel with the top and the bottom of the housing and at least a portion of the plurality of filaments are disposed within the through hole of the housing when the filament assembly is disposed within the housing.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 3A depicts a detail of the apparatus depicted in FIG. 3 in accordance with some embodiments of the present invention.

Figure 1:
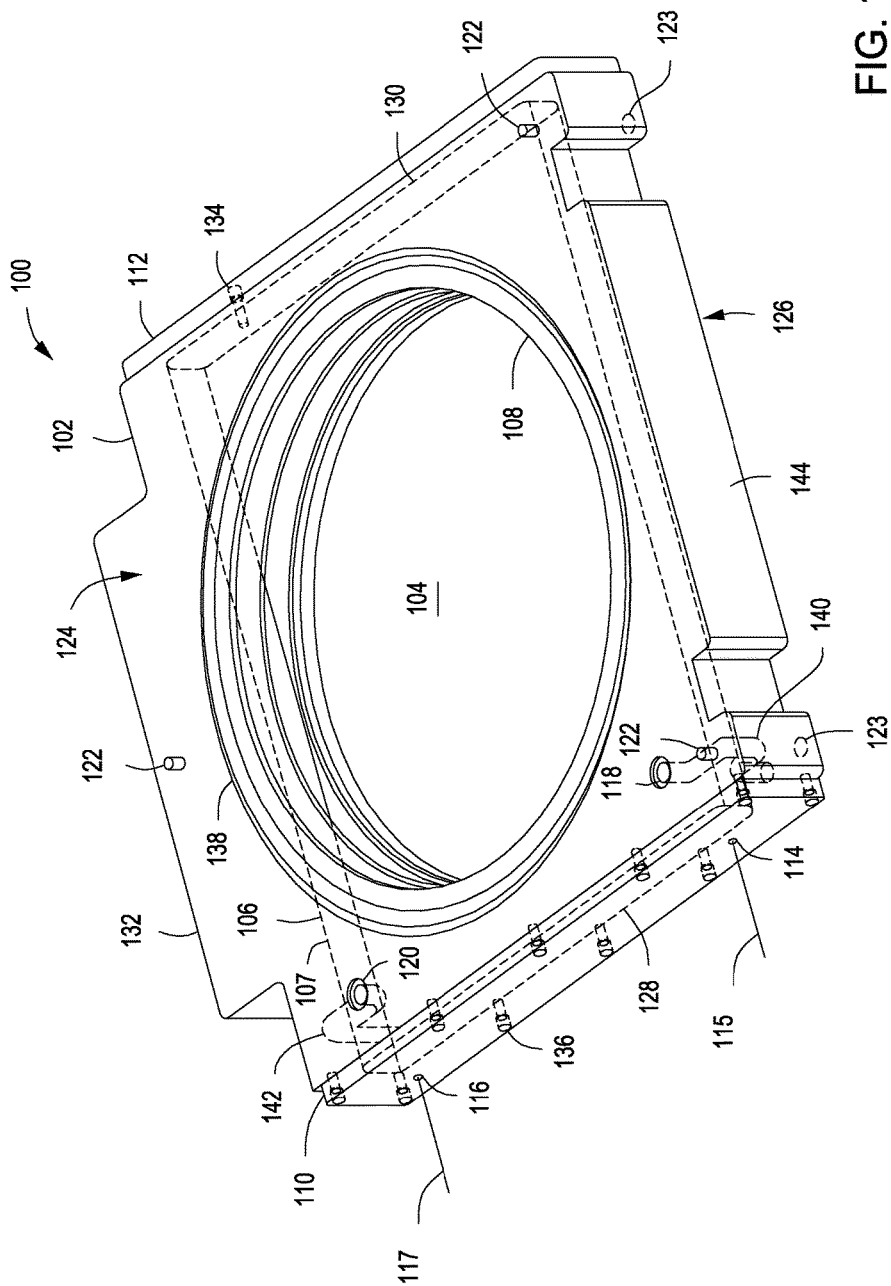
FIG. 1 depicts an apparatus for coupling a hot wire source to a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for coupling a hot wire source to a process chamber has been provided herein. In at least some embodiments the inventive apparatus may advantageously provides a filament assembly that may be easily removed and replaced, thereby allowing differently configured filament assemblies to be installed within the process chamber to perform desired processes. In addition, the inventive apparatus may facilitate the retrofitting of process chambers that are not originally configured for use with a hot wire source.

Referring to FIG. 1, the apparatus 100 generally includes a housing 102 having a filament assembly (hot wire source) 106 configured to be disposed within the housing 102. The housing 102 is configured to fit within and/or be coupled to a process chamber. For example, the housing 102 may be configured to be coupled between a chamber body and a chamber lid, such as in the process chamber described below with respect to FIG. 4. In some embodiments, the housing 102 generally comprises a top 124, a bottom 126, opposing sides 132, 144 coupling the top 124 to the bottom 126, a first open end 128 and an opposing second end 130 opposing the first open end. The second end 130 may be an open end as well. A recess 107 is formed in the housing between the first open end 128 and the second end 130 to fit the filament assembly 106 within the recess 107. A through hole 104 is formed through the top 124 and bottom 126 of the housing 102 to expose a portion of the filament assembly 106. The housing 102 may be fabricated from any suitable process compatible material, for example, a metal such as aluminum, stainless steel, or the like.

Figure 4:
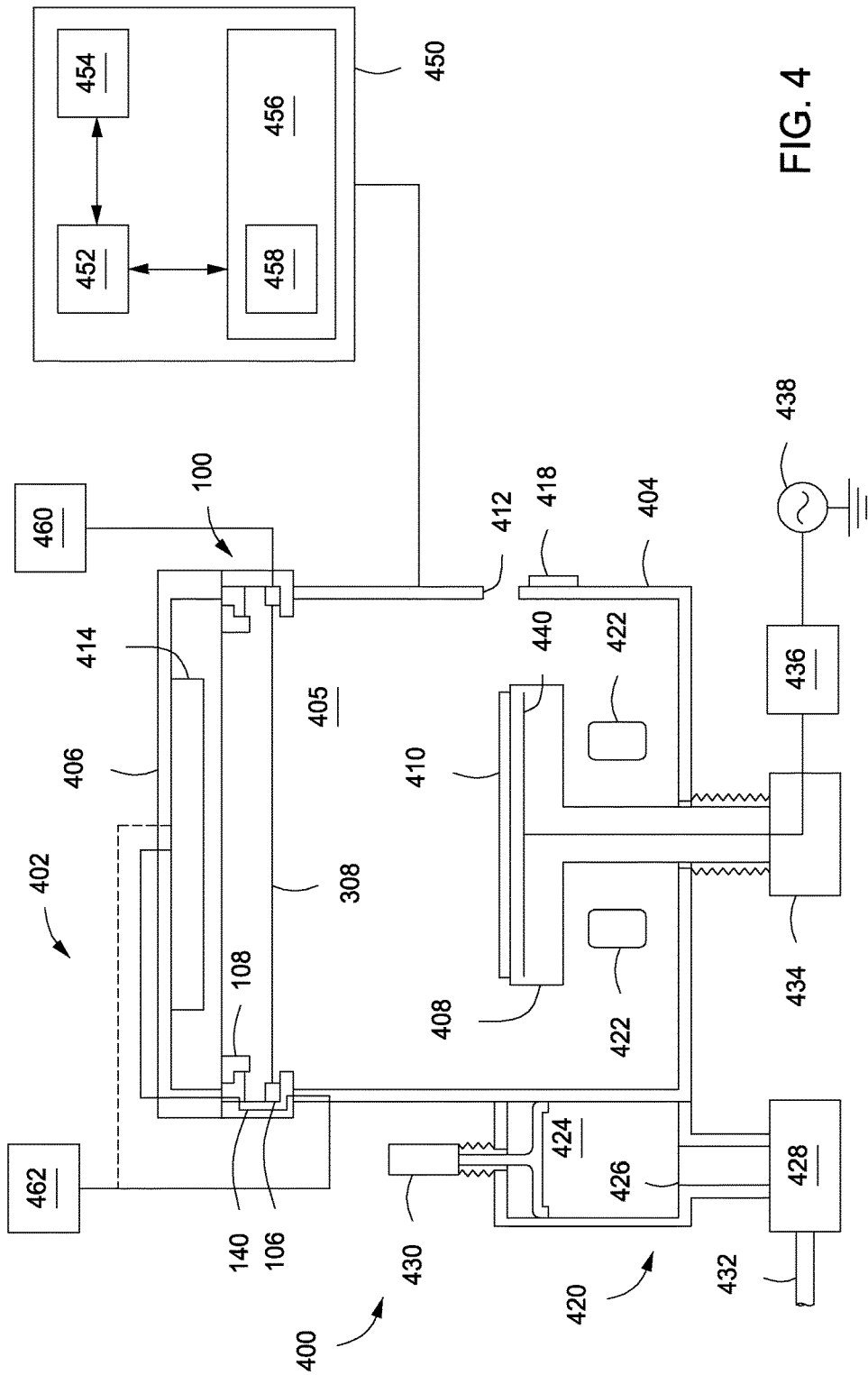
FIG. 4 depicts a process chamber suitable for use with an apparatus for coupling a hot wire source to a process chamber in accordance with some embodiments of the present invention.

In some embodiments, the top 124 and bottom 126 are configured to couple the housing 102 to, or to interface with, the process chamber (e.g., the bottom 126 to a chamber body and the top 124 to a chamber lid, as depicted in FIG. 4) and may comprise one or more features to facilitate such coupling or interfacing. For example, in some embodiments, one or more pins (three pins 122 shown) may be coupled to and, protrude from, the top 124 of the housing 102. When present, the one or more pins are configured to interface with features of the process chamber to provide a desired alignment of the housing 102 with respect to the process chamber. In some embodiments, the bottom 126 may include one or more pins (not shown) that function similar to the one or more pins of the top 124. Alternatively, the bottom 126 may include one or more openings (openings 123 shown in phantom) that can mate with one or more pins extending from the chamber body.

The through hole 104 exposes the filaments (shown in FIGS. 3-3A) of the filament assembly 106 to allow a process gas to be provided to the filaments and a resultant process resource (e.g., a dissociated gas) formed by an interaction of the process gas and the filaments to be provided to an inner volume of the process chamber to facilitate performing a process. In some embodiments, the through hole 104 may have dimensions suitable to expose a desired amount of filaments and, in some embodiments, may be dependent on a size of a gas distribution mechanism (e.g., showerhead, nozzles of the like) within the process chamber, an inner volume of the process chamber, or a size of a substrate being processed. In some embodiments, a channel 138 may be formed about the through hole 104 to accommodate an o-ring to facilitate forming an air tight seal between the housing 102 and process chamber when the housing 102 is coupled to the process chamber. In some embodiments, a liner 108 may be disposed on an inner surface of the through hole 104. When present, the liner 108 may protect exposed portions of the housing 102 during processing. The liner 108 may be fabricated from any suitable process compatible material, for example, aluminum, alumina ($Al_2O_3$), stainless steel, or the like. Although shown on just the top 124 of the housing 102, either or both of the channel 138 and liner 108 may also be provided on the bottom 126 of the housing 102.

In some embodiments, a first cover plate 110 and a second cover plate 112 may be coupled to the housing 102, to cover the first open end 128 and second end 130, respectively. The first cover plate 110 and the second cover plate 112 may be coupled to the housing 102 via a plurality of fasteners 134, 136. In some embodiments, the first cover plate 110 may comprise one or more electrical feedthroughs disposed through the first cover plate 110 to facilitate providing electrical power to the filament assembly 106. For example, in some embodiments, a first electrical feedthrough 114 may be disposed through the first cover plate 110 to facilitate providing power to the filament assembly 106 (via conductor 115 during use) and a second electrical feedthrough 116 may be disposed through the first cover plate 110 to provide a return path (via conductor 117) for the power provided via the first electrical feedthrough 114.

In some embodiments, one or more gas holes (two gas holes 118, 120 shown) may be disposed in the top 124 of the housing 102 to interface with gas inputs of the process chamber (such as chamber lid) to allow a flow of a process gas through the housing 102 to a gas distribution mechanism (e.g., a showerhead, nozzle, or the like) of the chamber lid when the apparatus is coupled to the process chamber. The one or more gas holes 118, 120 are fluidly coupled to respective gas holes (not shown) disposed in the bottom 126 of the housing 102 via respective conduits 140, 142 (partially shown in phantom) formed in the housing 102. The conduits 140, 142 provide a flow path from the gas holes in the bottom 126 to the gas holes 118, 120 in the top 124 such that the gas holes in the top 124 and the bottom 126 are positioned to align with respective gas holes in a chamber body and a chamber lid to which the housing will be attached (as discussed below with respect to FIG. 4) even when a straight line path is not available (for example due to the opening at the first open end 128). In some embodiments, each gas hole in the top 124 and bottom 126 may include a groove formed around the gas hole to accommodate an o-ring to provide a vacuum seal with components of the process chamber (e.g., a gas conduit) when the housing 102 is coupled to the process chamber.

Figure 2:
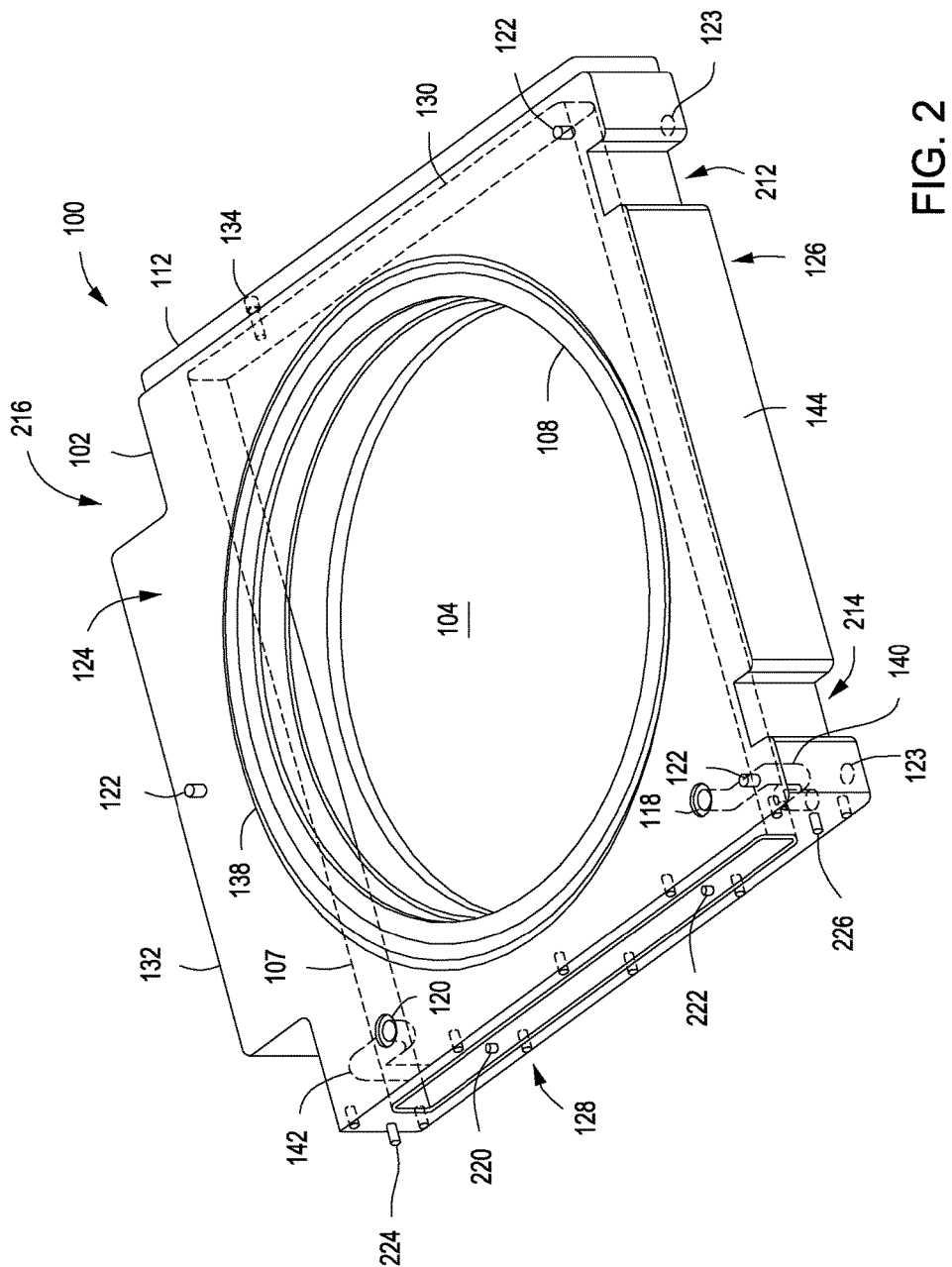
FIG. 2 depicts a portion of an apparatus for coupling a hot wire source to a process chamber in accordance with some embodiments of the present invention.

Referring to FIG. 2, in some embodiments, the housing 102 may include a plurality of features 212, 214, 216, 218, (e.g., extensions, cutouts or the like) to interface or with surfaces or features of the process chamber. For example, the housing 102 may have a peripheral geometry that is similar to or identical to the process chamber geometry at the interface of the chamber body and the chamber lid, such that the housing 102 may be interposed between the chamber body and the chamber lid. The bottom 126 of the housing 102 maintains all critical features for alignment, fluid coupling, or the like, as the chamber lid. Similarly, the top 124 of the housing 102 maintains all critical features for alignment, fluid coupling, or the like, as the chamber body. As such, the chamber lid may be coupled to the housing 102 just as it would be coupled to the chamber body and the chamber body may be coupled to the housing 102 just as it would be coupled to the chamber lid.

The first open end 128 is sized to allow the filament assembly (106 in FIG. 1) to be inserted into the housing 102 through the first open end 128. In some embodiments, a groove 210 may be formed about the first open end 128 to accommodate an o-ring to provide an air tight seal between the first cover plate (110 in FIG. 1) and the housing 102 when the first cover plate 110 is coupled to the housing. In some embodiments, one or more pins (two pins 224, 226 shown) may be disposed about the first open end 128, the pins 224, 226 configured to interface with holes formed in the first cover plate 110 to provide alignment of the first cover plate 110 and the housing 102 when the first cover plate 110 is coupled to the housing 102. In some embodiments, a similar groove (not shown) and pins (not shown) may be disposed about the second open end (second end 130 in FIG. 1) that function similar to the groove 210 and pins 224, 226 disposed about the first open end 128.

In some embodiments, one or more holes 220, 222 may be formed in the bottom 126 of the housing 102 within the first open end 128 to receive a fastener to facilitate securing the filament assembly 106 within the housing 102. In some embodiments, the holes 220, 222 may be threaded to interface with mating threads of the fasteners.

Figure 3:
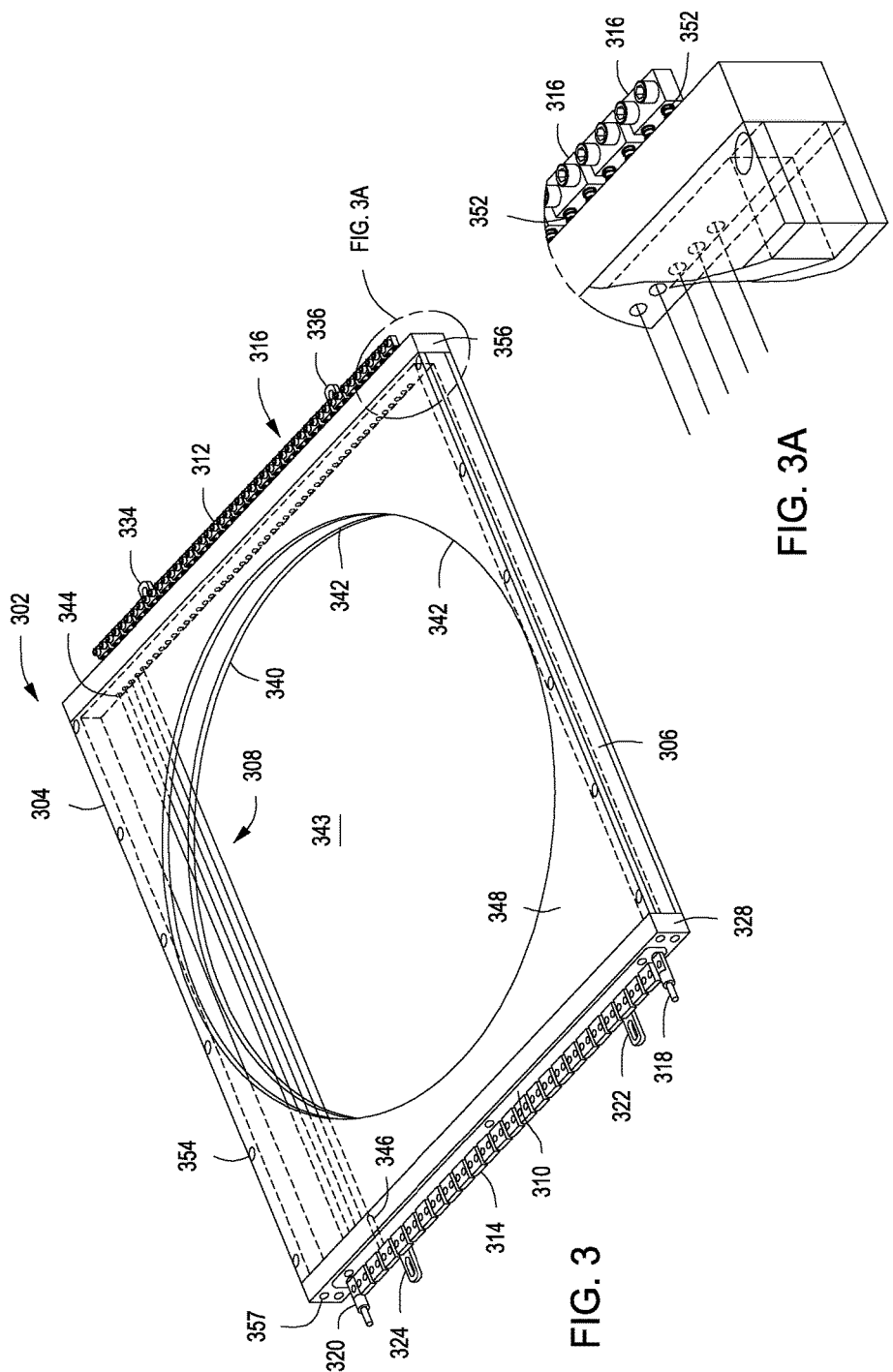
FIG. 3 depicts a portion of an apparatus for coupling a hot wire source to a process chamber in accordance with some embodiments of the present invention.

Referring to FIG. 3, in some embodiments, the filament assembly (hot wire source) 106 generally comprises a frame 302, a top 348 and bottom 340. The frame 302 may be fabricated from any suitable process compatible material, for example, a metal such as aluminum, stainless steel, or the like.

The top 348 and bottom 340 cover at least a portion of the frame 302 and, in some embodiments, provide additional structural support to the frame 302. The top 348 and bottom 340 may be coupled to the frame 302 via, for example, a plurality of fasteners 354. A through hole 342 is disposed through each of the top 348 and bottom 340 to form an opening 343 that corresponds with the opening defined by the through hole 104 in the top 124 and bottom 126 of the housing 102 (described above).

The frame 302 is generally rectangular in shape and sized to fit within the first open end (128 in FIGS. 1 and 2) to allow the filament assembly 106 to be inserted into the housing 102. Providing a frame 302 that is removable from the housing assembly allows for the filament assembly 106 to be easily removed and repaired (for example to replace a broken filament) or replaced with, for example, a different filament assembly 106 having the same or a different filament configuration to facilitate performing a desired process without removing the chamber lid. The frame 302 generally comprises a first end 310, a second end 312 and sides 304, 306 coupling the first end 310 to the second end 312.

In some embodiments, each of the first end 310 and second end 312 comprise a plurality of connectors 314, 316 configured to hold the plurality of filaments 308 within the frame 302 at a desired spacing and/or a desired tension and to provide electrical contact to the plurality of filaments 308. In some embodiments, a set of the plurality of connectors (e.g., the connectors 316 of the second end 312) may comprise springs 352 to exert a tension on the plurality of filaments 308 to prevent the filaments from sagging during processing, for example such as shown in FIG. 3A. In some embodiments, a tension of the filament 308 may be adjustable via either or both of the connectors 314, 316. Referring back to FIG. 3, in some embodiments, each of the first end 310 and second end 312 comprise a plurality of through holes 344, 346 to allow the plurality of filaments 308 to pass through the first end 310 and second end 312 to the connectors 314, 316. In such embodiments, each of the through holes 344, 346 may have a diameter sufficient to prevent contact with the filament and may optionally include an electrically insulating material disposed within each of the through holes 344, 346 to facilitate electrically isolating the plurality of filaments 308 from the first end 310 and second end 312.

In some embodiments, each of the first end 310 and the second end 312 comprises a plurality of tabs 322, 324, 334, 336 configured to correspond with the holes 220, 222 formed in the housing 102 to facilitate securing the filament assembly 106 within the housing 102. In some embodiments, each of the first end 310 and second end 312 may have an outer member 328, 356 to couple the first end 310 and the second end 312 to the frame 302. The outer member 328, 356 includes a plurality of through holes 357 to receive fasteners to couple the first end 310 and second end 312 to the sides 304, 306.

In some embodiments, the first end 310 comprises a first electrical coupling 318 and a second electrical coupling 320 to interface with the first electrical feedthrough 114 and second electrical feedthrough 116 of the housing 102 (described above) to facilitate providing electrical power to the plurality of filaments 308. In such embodiments, the first electrical feedthrough 114 and second electrical feedthrough 116 are electrically coupled to the plurality of filaments 308 to facilitate providing power to the plurality of filaments 308.

Power may be provided to the plurality of filaments 308 as a group (e.g., in a single zone), or in multiple zones each comprising one or more filaments 308. For example, in some embodiments, the one or more filaments 308 may be configured in a single zone. In such embodiments, the one or more filaments 308 may be electrically coupled to one another in parallel and provided power from a single power source. Alternatively, in some embodiments, the one or more filaments 308 may be configured in a plurality of zones. The one or more filaments 308 may be configured in any number of zones, for example such as two zones or three zones. In some embodiments, each zone of the plurality of zones may be coupled have a separate power source to allow for independent adjustment of each zone of the plurality of zones. Examples of such zoned configurations that may be used in combination with the one or more filaments 308 described herein is disclosed in greater detail in U.S. patent application Ser. No. 13/723,409, filed Dec. 21, 2012, entitled, "Methods and Apparatus for Cleaning Substrate Surfaces with Hydrogen".

Although only two filaments of the plurality of filaments 308 are shown in FIG. 3, it is to be understood that the plurality of filaments 308 may include any number of filaments sufficient to cover a desired area within the frame 302. In some embodiments, the plurality of filaments (wires) 308 may be separate wires, or may be a single wire routed back and forth across the frame 302. The plurality of filaments 308 may comprise any suitable conductive material, for example, such tungsten, tantalum, iridium, nickel-chrome, palladium, or the like. The plurality of filaments 308 may have any thickness, geometry and/or density suitable to facilitate a desired process in the process chamber, and may be dependent on, for example, a substrate composition, materials and/or process gases utilized in the process and the dimensions of the process chamber. In some embodiments, a distance between each filament of the plurality of filaments 308 (i.e., the wire to wire distance) may be varied in accordance with a particular application.

FIG. 4 depicts a system 400 suitable for processing a substrate in accordance with some embodiments of the present invention. The system 400 may comprise a controller 450 and a process chamber 402 having an exhaust system 420 for removing excess process gases, processing by-products, or the like, from the interior of the process chamber 402. Exemplary process chambers may include chemical vapor deposition (CVD) or other process chambers, available from Applied Materials, Inc. of Santa Clara, Calif. Other suitable process chambers may similarly be used.

The process chamber 402 has a chamber body 404 and a chamber lid 406 generally enclosing a processing volume 405. The processing volume 405 may be defined, for example, between a substrate support pedestal 408 disposed within the process chamber 402 for supporting a substrate 410 thereupon during processing and one or more gas inlets, such as a showerhead 414 coupled to the chamber lid 406 and/or nozzles provided at desired locations. In some embodiments, the inventive apparatus 100 may be coupled to the process chamber 402 disposed between the chamber body 404 and the chamber lid 406. In such embodiments, one or more process gases may be provided to the filaments 308 of the filament assembly (hot wire source) 106 via the showerhead 414 to facilitate a process within the processing volume 405. A power supply 460 (e.g., a DC power supply) is coupled to the apparatus 100 to provide power to the filaments 308.

In some embodiments, the substrate support pedestal 408 may include a mechanism that retains or supports the substrate 410 on the surface of the substrate support pedestal 408, such as an electrostatic chuck, a vacuum chuck, a substrate retaining clamp, or the like (not shown). In some embodiments, the substrate support pedestal 408 may include mechanisms for controlling the substrate temperature (such as heating and/or cooling devices, not shown) and/or for controlling the species flux and/or ion energy proximate the substrate surface.

For example, in some embodiments, the substrate support pedestal 408 may include an RF bias electrode 440. The RF bias electrode 440 may be coupled to one or more bias power sources (one bias power source 438 shown) through one or more respective matching networks (matching network 436 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 440 at respective frequencies of about 2 MHz and about 13.56 MHz. In some embodiments, three bias power sources may be provided for coupling RF power through respective matching networks to the RF bias electrode 440 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 410 may enter the process chamber 402 via an opening 412 in a wall of the process chamber 402. The opening 412 may be selectively sealed via a slit valve 418, or other mechanism for selectively providing access to the interior of the chamber through the opening 412. The substrate support pedestal 408 may be coupled to a lift mechanism 434 that may control the position of the substrate support pedestal 408 between a lower position (as shown) suitable for transferring substrates into and out of the chamber via the opening 412 and a selectable upper position suitable for processing. The process position may be selected to maximize process uniformity for a particular process. When in at least one of the elevated processing positions, the substrate support pedestal 408 may be disposed above the opening 412 to provide a symmetrical processing region.

A gas supply 462 may be coupled to the apparatus 100 and/or showerhead 414 to provide one or more process gases to the apparatus 100 and/or showerhead 414 for processing. For example, the gas supply 462 may be coupled to the chamber body 404 with the provided gas traveling through the chamber body 404, through the housing 102 (e.g., via conduits 140), and through the chamber lid 406 to the showerhead 414. Alternatively, the gas supply 462 may be coupled directly to the showerhead, as shown in phantom. The apparatus 100 may advantageously be configured to interface with the process chamber 402 in essentially its existing configuration. Although a showerhead 414 is shown in FIG. 4, additional or alternative gas inlets may be provided such as nozzles or inlets disposed in the ceiling or on the sidewalls of the process chamber 402 or at other locations suitable for providing gases as desired to the process chamber 402, such as the base of the process chamber, the periphery of the substrate support pedestal, or the like.

The exhaust system 420 generally includes a pumping plenum 424 and one or more conduits that couple the pumping plenum 424 to the inner volume (and generally, the processing volume 405) of the process chamber 402, for example via one or more inlets 422 (two inlets shown in FIG. 4). A vacuum pump 428 may be coupled to the pumping plenum 424 via a pumping port 426 for pumping out the exhaust gases from the process chamber 402. The vacuum pump 428 may be fluidly coupled to an exhaust outlet 432 for routing the exhaust as needed to appropriate exhaust handling equipment. A valve 430 (such as a gate valve, or the like) may be disposed in the pumping plenum 424 to facilitate control of the flow rate of the exhaust gases in combination with the operation of the vacuum pump 428. Although a z-motion gate valve is shown, any suitable, process compatible valve for controlling the flow of the exhaust may be utilized.

To facilitate control of the process chamber 402 as described above, the controller 450 may be one of any form of general-purpose computer processor that can be used in an industrial setting for controlling various chambers and sub-processors. The memory, or computer-readable medium, 456 of the CPU 452 may be one or more of readily available memory such as random access memory (RAM), read only memory (ROM), floppy disk, hard disk, or any other form of digital storage, local or remote. The support circuits 454 are coupled to the CPU 452 for supporting the processor in a conventional manner. These circuits include cache, power supplies, clock circuits, input/output circuitry and subsystems, and the like.

Processes may generally be stored in the memory 456 as a software routine 458 that, when executed by the CPU 452, causes the process chamber 402 to perform processes of the present invention. The software routine 458 may also be stored and/or executed by a second CPU (not shown) that is remotely located from the hardware being controlled by the CPU 452. Some or all of the method of the present invention may also be performed in hardware. As such, the process may be implemented in software and executed using a computer system, in hardware as, e.g., an application specific integrated circuit or other type of hardware implementation, or as a combination of software and hardware. The software routine 458 may be executed after the substrate 410 is positioned on the substrate support pedestal 408. The software routine 458, when executed by the CPU 452, transforms the general purpose computer into a specific purpose computer (controller) 450 that controls the chamber operation such that the processes are performed.

Thus, apparatus for coupling a hot wire source to a process chamber have been provided herein. Embodiments of the inventive apparatus advantageously facilitates coupling of a hot wire source to a process chamber while providing ease of removal and/or replacement of the hot wire source from the process chamber without removing the chamber lid.

While the foregoing is directed to embodiments of the present invention, other and further embodiments of the invention may be devised without departing from the basic scope thereof.

The invention claimed is:

1. An apparatus for coupling a hot wire source to a process chamber, comprising:
   a housing having a first open end and a through hole formed through a top and a bottom of the housing; and
   a filament assembly configured to be disposed within the housing, wherein the first open end is sized to allow the filament assembly to be inserted into the housing through the first open end, the filament assembly having a frame and a plurality of filaments disposed across the frame, wherein the plurality of filaments of the filament assembly are substantially parallel with the top and the bottom of the housing and at least a portion of the plurality of filaments are disposed within the through hole of the housing when the filament assembly is disposed within the housing, wherein the bottom of the housing is configured to be coupled to a chamber body of the process chamber and the top is configured to be coupled to a lid of the process chamber.

2. The apparatus of claim 1, wherein the housing comprises one or more gas holes disposed through the housing and configured to interface with a gas input of the process chamber to allow a flow of process gas through the housing to a gas distribution mechanism of the process chamber.

3. The apparatus of claim 1, further comprising:
   a first cover plate removably coupled to the first open end to seal the first open end.

4. The apparatus of claim 1, wherein the plurality of filaments are configured in a plurality of zones and each zone of the plurality of zones is coupled to a separate power source.

5. The apparatus of claim 1, wherein the housing further comprises a second open end disposed opposite the first open end.

6. The apparatus of claim 5, wherein the housing further comprises a second cover plate removably coupled to the second open end to seal the second open end.

7. The apparatus of claim 1, further comprising a liner disposed about an inner surface of the through hole formed in the top and the bottom of the housing.

8. The apparatus of claim 1, wherein the frame comprises a first end, a second end and sides coupling the first end to the second end, wherein each of the first end and the second end comprise a plurality of through holes and a plurality of connectors, wherein each of the plurality of filaments are disposed through respective ones of the plurality of through holes and held in place by respective ones of the plurality of connectors.

9. The apparatus of claim 8, wherein a set of the plurality of connectors comprise springs to maintain a desired tension on each of the plurality of filaments.

10. The apparatus of claim 8, wherein the frame further comprises a top and bottom disposed on a respective top and bottom of the frame, the top and bottom having a through hole corresponding to the through hole formed in the top and the bottom of the housing.

11. A process chamber, comprising:
a chamber body having a lid;
a showerhead disposed beneath the lid; and
a hot wire source coupled to the chamber body, wherein the hot wire source comprises the apparatus as claimed in claim 1, and wherein the through hole is aligned with the showerhead.

12. The process chamber of claim 11, further comprising:
a gas supply coupled to the showerhead to provide a gas to the process chamber.

13. The process chamber of claim 12, wherein the gas supply is coupled to the showerhead through the housing of the apparatus for coupling the hot wire source to the process chamber.

14. The process chamber of claim 11, further comprising:
a power supply coupled to the hot wire source to provide power to the plurality of filaments.

15. An apparatus for coupling a hot wire source to a process chamber, comprising:
a housing having a first open end and a through hole formed through a top and a bottom of the housing, wherein the bottom of the housing is configured to be coupled to a chamber body of a process chamber and the top is configured to be coupled to a lid of the process chamber;

a filament assembly configured to be disposed within the housing, wherein the first open end is sized to allow the filament assembly to be inserted into the housing through the first open end, the filament assembly having a frame and a plurality of filaments disposed across the frame, wherein the plurality of filaments of the filament assembly are substantially parallel with the top and the bottom of the housing and at least a portion of the plurality of filaments are disposed within the through hole of the housing when the filament assembly is disposed within the housing; and a first cover plate removably coupled to the first open end to seal the first open end, wherein the first cover plate comprises a first electrical feedthrough disposed through the first cover plate and configured to interface with a first electrical coupling of the filament assembly to provide electrical power to the filament assembly and a second electrical feedthrough disposed through the first cover plate and configured to interface with a second electrical coupling to provide a return path for the electrical power provided to the filament assembly.

16. The apparatus of claim 15, wherein the housing comprises one or more gas holes disposed through the housing and configured to interface with a gas input of the process chamber to allow a flow of process gas through the housing to a gas distribution mechanism of the process chamber.

17. The apparatus of claim 15, wherein the housing further comprises a second open end disposed opposite the first open end and a second cover plate removably coupled to the second open end to seal the second open end.

18. The apparatus of claim 15, wherein the frame comprises a first end, a second end, sides coupling the first end to the second end, and a top and bottom disposed on a respective top and bottom of the frame, wherein the top and bottom each have a through hole corresponding to the through hole formed in the top and the bottom of the housing, wherein each of the first end and the second end comprise a plurality of through holes and a plurality of connectors, wherein each of the plurality of filaments are disposed through respective ones of the plurality of through holes and held in place by respective ones of the plurality of connectors.

19. The apparatus of claim 18, wherein a set of the plurality of connectors comprise springs to maintain a desired tension on each of the plurality of filaments.

* * * * *